(12) United States Patent
Suzuki et al.

(10) Patent No.: US 10,923,323 B2
(45) Date of Patent: Feb. 16, 2021

(54) PLASMA GENERATING UNIT AND PLASMA PROCESSING APPARATUS

(71) Applicant: Tokyo Electron Limited, Tokyo (JP)

(72) Inventors: Takashi Suzuki, Miyagi (JP); Yoshikazu Azumaya, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 80 days.

(21) Appl. No.: 16/021,444

(22) Filed: Jun. 28, 2018

(65) Prior Publication Data
US 2019/0006152 A1    Jan. 3, 2019

(30) Foreign Application Priority Data

Jun. 30, 2017    (JP) .................................. 2017-129418

(51) Int. Cl.
*H01J 37/32*    (2006.01)

(52) U.S. Cl.
CPC .... *H01J 37/32238* (2013.01); *H01J 37/3222* (2013.01); *H01J 37/32229* (2013.01); *H01J 37/32449* (2013.01); *H01J 37/32458* (2013.01); *H01J 2237/332* (2013.01)

(58) Field of Classification Search
USPC ............................. 118/723 MW; 156/345.41
See application file for complete search history.

(56) References Cited

U.S. PATENT DOCUMENTS

| | | | | |
|---|---|---|---|---|
| 6,388,632 B1* | 5/2002 | Murakawa | ........ | H01J 37/32192 118/723 MW |
| 2003/0168008 A1* | 9/2003 | Ohmi | ................ | H01J 37/32229 118/715 |
| 2007/0137573 A1* | 6/2007 | Kholodenko | ..... | H01J 37/32091 118/723 E |
| 2009/0314629 A1* | 12/2009 | Nishimoto | ........ | H01J 37/32192 204/164 |
| 2009/0317566 A1* | 12/2009 | Nishimoto | ........ | H01J 37/32192 427/575 |
| 2011/0121058 A1* | 5/2011 | Nishimoto | ........ | H01J 37/32192 228/121 |
| 2012/0160809 A1* | 6/2012 | Ishibashi | ............... | C23C 16/511 216/69 |
| 2014/0262034 A1* | 9/2014 | Ishibashi | ............... | H01J 37/321 156/345.29 |

FOREIGN PATENT DOCUMENTS

JP    2013-016443 A    1/2013

* cited by examiner

*Primary Examiner* — Rakesh K Dhingra
(74) *Attorney, Agent, or Firm* — Pearne & Gordon LLP (57) ABSTRACT

A plasma generating unit capable of improving in-surface uniformity of plasma and a plasma processing apparatus using the same are provided. The plasma generating unit provided in the plasma processing apparatus includes a dielectric window 16; a slot plate 20 provided on the dielectric window 16; and a coaxial waveguide electrically connected to the slot plate 20 and configured to transmit a microwave. The coaxial waveguide includes an inner conductor 31; and an outer conductor 32 configured to surround the inner conductor 31. The plasma generating unit further includes a pressing component PM configured to elastically press the inner conductor 31 toward the slot plate.

6 Claims, 10 Drawing Sheets

PLASMA GENERATING UNIT AND PLASMA PROCESSING APPARATUS

CROSS-REFERENCE TO RELATED APPLICATION

This application claims the benefit of Japanese Patent Application No. 2017-129418 filed on Jun. 30, 2017, the entire disclosures of which are incorporated herein by reference.

TECHNICAL FIELD

The embodiments described herein pertain generally to a plasma generating unit configured to generate plasma under a dielectric window by irradiating a microwave to a slot plate on the dielectric window, and, also, to a plasma processing apparatus using the same.

BACKGROUND

Conventionally, a plasma processing apparatus has been used in various fields. A plasma processing apparatus described in Patent Document 1 is a plasma etching apparatus using a radial line slot antenna as a plasma source and is configured to improve uniformity of a processing amount within a surface of a substrate. In the plasma etching apparatus using the radial line slot antenna, a slot antenna having a multiple number of slots is provided on a dielectric window of a processing vessel. A microwave radiated from the multiple number of slots of the slot antenna is introduced into a processing space of the processing vessel through the dielectric window. A processing gas is excited into plasma by energy of the microwave.

Patent Document 1: Japanese Patent Laid-open Publication No. 2013-016443

SUMMARY

It is, however, still required to further improve in-surface uniformity of the plasma. In view of the foregoing, exemplary embodiments provide a plasma generating unit capable of improving in-surface uniformity of plasma and a plasma processing apparatus using the same.

In an exemplary embodiment, a plasma generating unit provided in a plasma processing apparatus includes a dielectric window; a slot plate provided on the dielectric window; and a coaxial waveguide electrically connected to the slot plate and configured to transmit a microwave. The coaxial waveguide includes an inner conductor; and an outer conductor configured to surround the inner conductor. The plasma generating unit further includes a pressing component configured to elastically press the inner conductor toward the slot plate.

Regarding this structure, when assembling the plasma generating unit, the slot plate may be previously mounted on the dielectric window, and, then, the inner conductor pressurized by the pressing component may be installed such that it is in contact with the slot plate. That is, the positioning accuracy between the slot plate and the dielectric window at the time when they are assembled does not rely on the positioning accuracy of the inner conductor.

As a comparative example, there may be considered a case where the inner conductor is previously fixed to the slot plate to be in contact therewith and an upper unit including the inner conductor and the slot plate is fastened to the dielectric window. In this case, the positioning accuracy of the slot plate with respect to the dielectric window depends on the positioning accuracy of the inner conductor. Since this upper unit has a large volume, it is difficult to check an underneath position when assembling this upper unit. Thus, the assembling accuracy of this upper unit is lower than that in case of fastening the slot plate alone to the dielectric window.

Meanwhile, in the plasma generating unit according to the exemplary embodiment, since the inner conductor can be mounted after fastening the slot plate to the dielectric window, the positioning accuracy between the slot plate and the dielectric window is improved. According to researches of the present inventors, it is found out that in-surface uniformity of plasma relies on the positioning accuracy between the slot plate and the dielectric window. If this positioning accuracy is reduced, the in-surface uniformity of the plasma is degraded, and, on some occasions, even an abnormal discharge is observed. Particularly, in case that the dielectric window has a pattern such as a recess, the positioning accuracy may further contribute to the in-surface uniformity of the plasma. As stated, in the plasma generating unit according to the first exemplary embodiment, since the positioning accuracy is improved, the in-surface uniformity of the plasma can be bettered.

The plasma generating unit provided in a plasma processing apparatus further includes a spring provided between the inner conductor and the slot plate. The inner conductor is brought into contact with the slot plate from the rear side thereof, pressurizing the slot plate. If the spring (compression spring) is placed at a contact position while the inner conductor is pressurized by the pressing component, when a strong force is applied to the inner conductor by the pressing component, the spring resists against a pressing force caused by the pressing component, so that there is generated a force pressurizing the inner conductor in the reverse direction. Accordingly, a contact pressure between the inner conductor and the slot plate can be appropriately maintained, and, also, the inner conductor can be brought into secure contact with the slot plate. Furthermore, by using a conductive material such as stainless steel or aluminum for the spring, the inner conductor and the slot plate can be electrically connected as well in a secure manner. Though it might be desirable to use, as the spring, a shield spiral, a spiral coil or a gasket surrounding an axis of the inner conductor, the type of the spring is not merely limited to these examples as along as the spring is a compression spring because all compression springs have the same function.

The plasma generating unit provided in a plasma processing apparatus further includes a wavelength shortening plate guide ring provided on the slot plate; a wavelength shortening plate placed at an inner side of the wavelength shortening plate guide ring such that a position thereof is restricted; and a temperature control jacket provided on the wavelength shortening plate.

The wavelength shortening plate is configured to shorten (compress) a wavelength of the microwave transmitted in the coaxial waveguide. Since a position of the wavelength shortening plate is restricted by the wavelength shortening plate guide ring on the slot plate, the positioning accuracy between the slot plate and the wavelength shortening plate can be improved. The temperature control jacket (cover) is configured to adjust temperatures of the wavelength shortening plate, the coaxial waveguide, the slot plate, and so forth which are thermally connected thereto. The temperature control jacket has therein a passage through which a temperature control fluid is flown. If a cooled medium is flown in this passage, the components thermally connected to this temperature control jacket are cooled.

The plasma generating unit provided in a plasma processing apparatus further includes a first position fixing pin provided between the dielectric window and the wavelength shortening plate guide ring to be inserted through a positioning hole provided at the slot plate; and a second position fixing pin provided between the temperature control jacket and the wavelength shortening plate guide ring.

According to this structure, positions of the dielectric window, the slot plate and the wavelength shortening plate guide ring are fixed by the first and second position fixing pins.

The plasma generating unit provided in a plasma processing apparatus further includes a flange component fixed to the outer conductor. The flange component is engaged with an inner side surface of a through hole provided in the temperature control jacket, and the outer conductor is located within the through hole.

According to this structure, positioning of the outer conductor with respect to the temperature control jacket can be easily performed.

In another exemplary embodiment, a plasma processing apparatus includes any one of the described plasma generating unit at a processing vessel. Since in-surface uniformity of plasma can be improved, a uniform processing can be performed on a target object.

According to the plasma generating unit and the plasma processing apparatus of the exemplary embodiments, the in-surface uniformity of the plasma can be improved.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, exemplary embodiments will be described in detail with reference to the accompanying drawings. In the specification and the drawings, substantially same components will be assigned same reference numerals.

Figure 1:
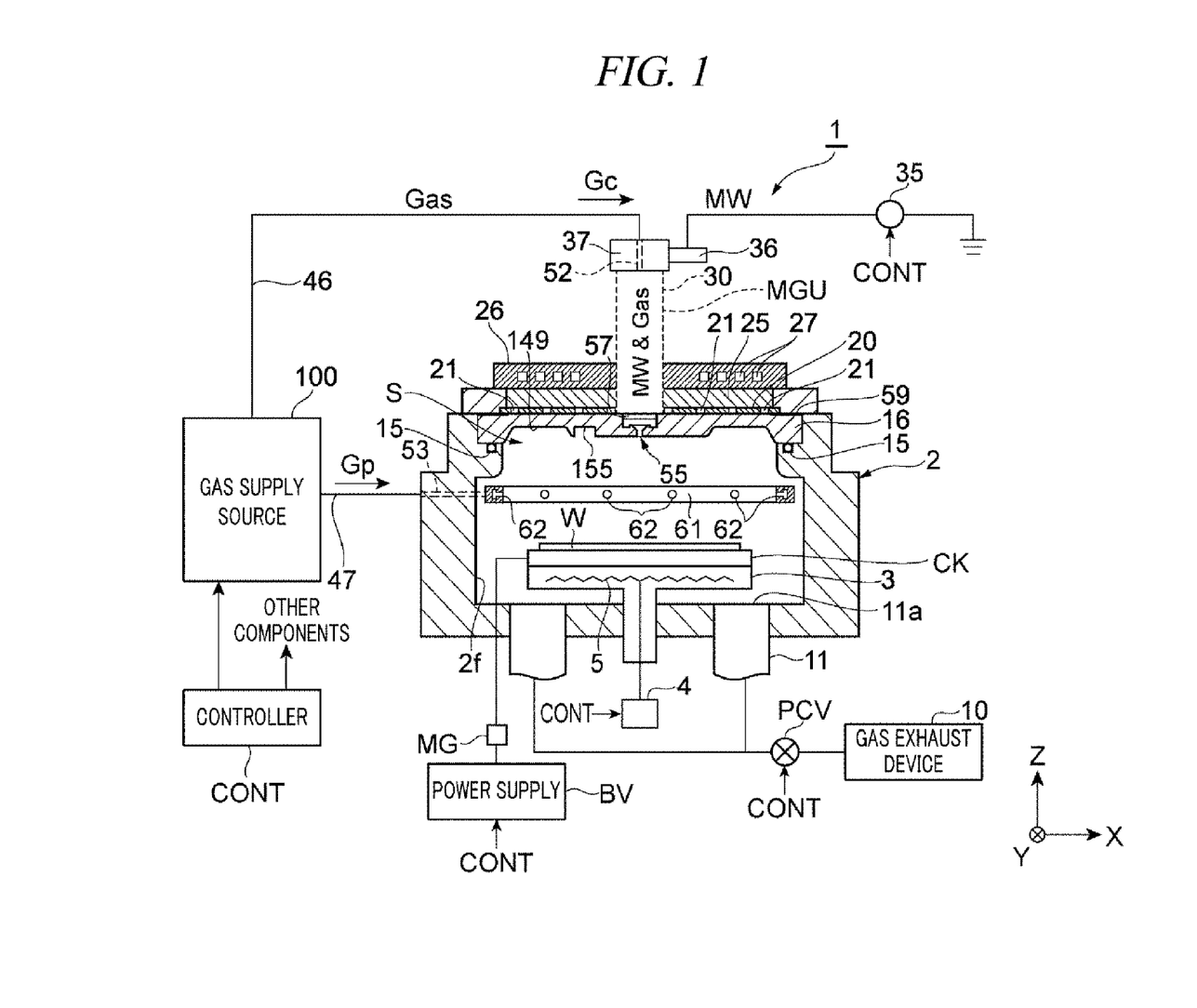
FIG. 1 is a longitudinal cross sectional view of a plasma processing apparatus according to an exemplary embodiment.

FIG. 1 is a longitudinal cross sectional view of a plasma processing apparatus according to an exemplary embodiment.

A plasma processing apparatus 1 includes a cylindrical processing vessel 2. A ceiling of the processing vessel 2 is closed by a dielectric window (ceiling plate) 16 made of a dielectric material. The processing vessel 2 is made of, by way of example, aluminum and is electrically grounded. An inner wall surface of the processing vessel 2 is coated with an insulating protective film 2f such as alumina.

A placing table 3 configured to place thereon a semiconductor wafer (hereinafter, simply referred to as "wafer") W as a substrate is provided at a center of a bottom portion of the processing vessel 2. The wafer W is held on a top surface of the placing table 3. The placing table 3 is made of a ceramic material such as, but not limited to, alumina or alumina nitride. A heater 5 is embedded in the placing table 3 and configured to heat the wafer W to a preset temperature. The heater 5 is connected to a heater power supply 4 via a wiring accommodated in a supporting column.

An electrostatic chuck CK configured to electrostatically attract the wafer W placed on the placing table 3 is provided on the top surface of the placing table 3. The electrostatic chuck CK is connected via a matching device MG to a bias power supply BV configured to apply a DC bias power or a high frequency bias power.

Provided at the bottom portion of the processing vessel 2 is a gas exhaust pipe 11 through which a processing gas is exhausted from a gas exhaust opening 11a located below the surface of the wafer W placed on the placing table 3. The gas exhaust pipe 11 is connected with a gas exhaust device 10 such as a vacuum pump via a pressure control valve PCV.

The gas exhaust device 10 communicates with the inside of the processing vessel 2 via a pressure control valve PCV. An internal pressure of the processing vessel 2 is adjusted to a preset pressure by the pressure control valve PCV and the gas exhaust device 10.

A dielectric window 16 is provided at the ceiling of the processing vessel 2 with a seal 15 such as an O-ring therebetween to achieve airtightness. The dielectric window 16 is made of a dielectric material such as, but not limited to, quartz, alumina ($Al_2O_3$) or aluminum nitride (AlN), and a microwave can be transmitted through the dielectric window 16.

A disk-shaped slot plate 20 is provide on a top surface of the dielectric window 16. The slot plate 20 is made of a conductive material such as, but not limited to, copper plated or coated with Ag, Au, or the like. The slot plate 20 is provided with a multiple number of T-shaped or L-shaped slots 21 which are arranged concentrically.

A wavelength shortening plate 25 configured to shorten (compress) a wavelength of a microwave is provided on a top surface of the slot plate 20. The wavelength shortening plate 25 is made of a dielectric material such as, but not limited to, quartz ($SiO_2$), alumina ($Al_2O_3$) or aluminum nitride (AlN). The wavelength shortening plate 25 is covered with a conductive cover (temperature control jacket) 26 made of, by way of non-limiting example, aluminum. An annular heat transfer medium path 27 is provided within the temperature control jacket (cover) 26. The cover 26 and the wavelength shortening plate 25 are adjusted to have a preset temperature by the heat transfer medium flown in the heat transfer medium path 27. As for a microwave having a wavelength of 2.45 GHz, for example, the wavelength of this microwave becomes about 12 cm in a vacuum and about 3 cm to 4 cm in the dielectric window 16 made of the alumina.

Figure 2:
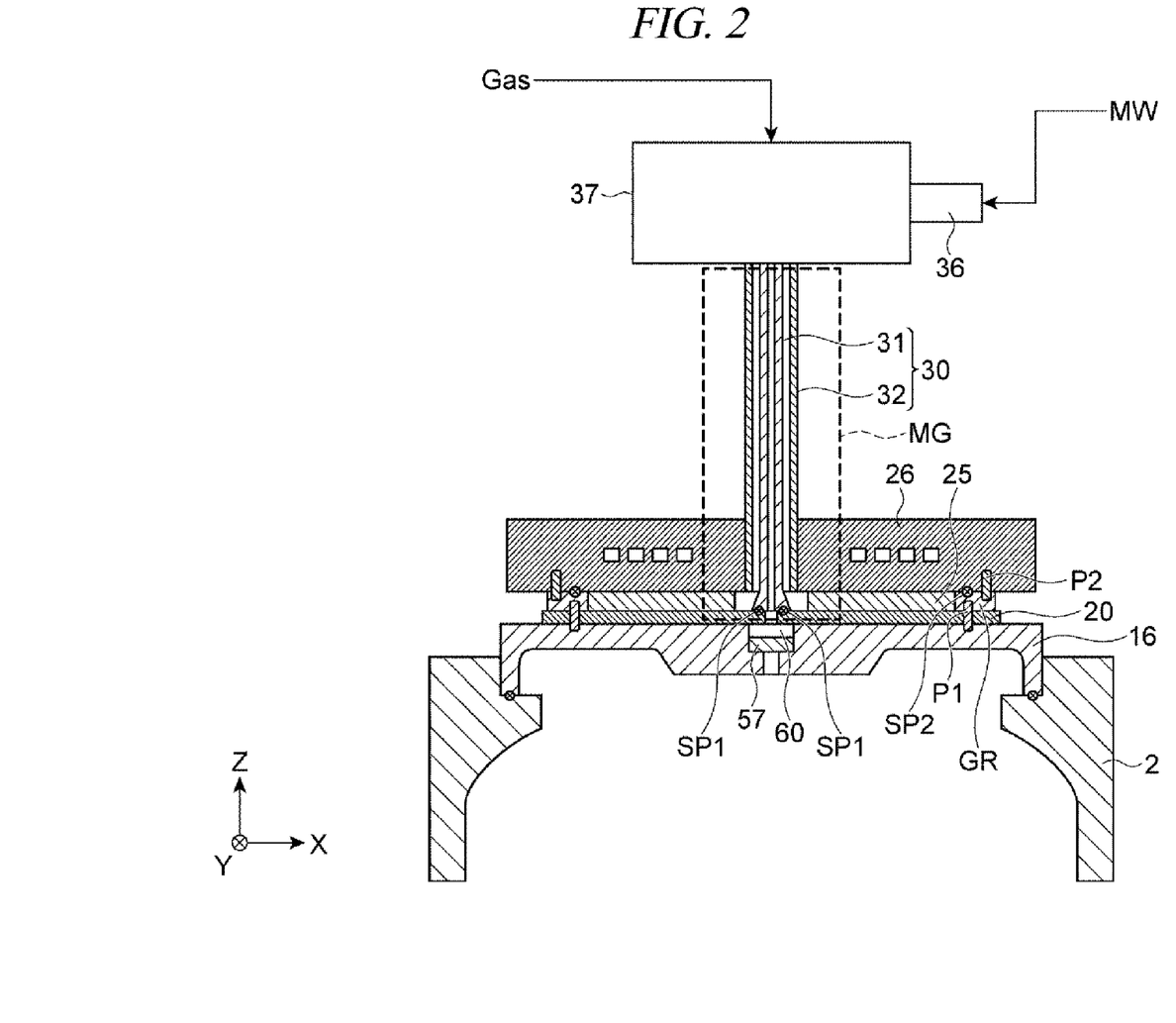
FIG. 2 is a diagram illustrating a cross sectional configuration of a plasma generating unit according to the exemplary embodiment.

A coaxial waveguide 30 configured to transmit the microwave is connected to a center of the cover 26. A unit including the coaxial waveguide 30 is referred to as a microwave and gas supply unit MGU. Details of the microwave and gas supply unit MGU is illustrated in FIG. 2, and the coaxial waveguide 30 includes an inner conductor 31 and an outer conductor 32. The inner conductor 31 is connected to a center of the slot plate 20 through a center of the wavelength shortening plate (dielectric plate) 25.

As depicted in FIG. 1, the coaxial waveguide 30 is connected to a microwave generator 35 via a mode converter 37 and a rectangular waveguide 36. Besides the aforementioned microwave of 2.45 GHz, a microwave of 860 MHz, 915 MHz or 8.35 GHz may be used.

The microwave generated by the microwave generator 35 is propagated through the rectangular waveguide 36 as a microwave inlet path, the mode converter 37, the coaxial waveguide 30 and the wavelength shortening plate 25. The microwave transmitted to the wavelength shortening plate 25 is supplied into the processing vessel 2 from the multiple number of slots 21 of the slot plate 20 through the dielectric window 16. An electric field is formed under the dielectric window 16 by the microwave, so that the processing gas in the processing vessel 2 is excited into plasma.

A lower end of the inner conductor 31 connected to the slot plate 20 has a circular truncated cone shape. Accordingly, the microwave is transmitted from the coaxial waveguide 30 to the wavelength shortening plate 25 and the slot plate 20 efficiently without a loss.

A characteristic of the microwave plasma generated by the radial line slot antenna lies in that plasma which has energy of a relatively high electron temperature and is generated directly under the dielectric window 16 (referred to as "plasma excitation region") is diffused, and, accordingly, this plasma becomes to have a relatively low electron temperature of about 1 eV to 2 eV directly above the wafer W (referred to as "plasma diffusion region"). That is, this microwave plasma is different from parallel plate type plasma or the like, and has a characteristic that the electron temperature of the plasma is distributed clearly as a function of a distance from the dielectric window 16. To be more specific, the electron temperature ranging from several eV to about 10 eV directly under the dielectric window 16 is reduced to about 1 eV to 2 eV directly above the wafer W. Since a processing of the wafer W is performed in the region (plasma diffusion region) where the electron temperature of the plasma is low, a big damage such as a recess may not be caused on the wafer W. If the processing gas is supplied into the region (plasma excitation region) where the electron temperature of the plasma is high, the processing gas is easily excited to be dissociated. Meanwhile, if the processing gas is supplied into the region (plasma diffusion region) where the electron temperature of the plasma is low, the degree of the dissociation is suppressed as compared to a case where the processing gas is supplied in the vicinity of the plasma excitation region.

A central inlet unit 55 configured to supply the processing gas to a central portion of the wafer W is provided at a center of the dielectric window 16 provided at the ceiling of the processing vessel 2. A supply passage 52 for the processing gas is formed in the inner conductor 31 of the coaxial waveguide 30. The central inlet unit 55 is connected to the supply passage 52.

The central inlet unit 55 is equipped with a circular column-shaped block 57 fitted into a cylindrical space provided at the center of the dielectric window 16; a gas storage portion 60 prepared by providing an appropriate gap between a bottom surface of the inner conductor 31 of the coaxial waveguide 30 and a top surface of the block 57; and a taper-shaped space portion in which a circular column-shaped space having a gas discharging opening at a leading end thereof is continued. The block 57 is made of a conductive material such as aluminum, and is electrically grounded. Multiple central inlet openings are formed through the block 57 in a vertical direction thereof. Further, the shape of the space portion is not limited to the taper shape but may have a cylindrical shape. Furthermore, when viewed from the top, each of the central inlet openings may be formed to have a complete circular shape or an elongated hole shape in consideration of a required conductance or the like. The block 57 made of the aluminum is coated with anodically oxidized alumina ($Al_2O_3$) or yttria ($Y_2O_3$).

The processing gas supplied into the gas storage portion 60 from the supply passage 52 penetrating the inner conductor 31 having a pipe shape is discharged downwards toward the central portion of the wafer W from the multiple central inlet openings of the block 57 after being diffused in the gas storage portion 60.

Within the processing vessel 2, a ring-shaped peripheral inlet unit 61 configured to supply the processing gas to a peripheral portion of the wafer W is provided to surround a space above the wafer W. The peripheral inlet unit 61 is located under the central inlet openings provided at the ceiling and above the wafer W placed on the placing table 3. The peripheral inlet unit 61 is implemented by a hollow pipe of a ring shape. Multiple peripheral inlet openings 62 are formed in an inner peripheral side of the peripheral inlet unit 61 with a preset gap therebetween in a circumferential direction. The processing gas is discharged toward a center of the peripheral inlet unit 61 through the peripheral inlet openings 62. The peripheral inlet unit 61 is made of, by way of non-limiting example, quartz. A supply passage 53 made of stainless steel is formed through a sidewall of the processing vessel 2. The supply passage 53 is connected to the peripheral inlet unit 61. The processing gas supplied into the peripheral inlet unit 61 from the supply passage 53 is discharged toward the inside of the peripheral inlet unit 61 from the multiple peripheral inlet openings 62 after being diffused in an internal space within the peripheral inlet unit 61. The processing gas discharged from the multiple peripheral inlet openings 62 is supplied to above the peripheral portion of the wafer W. Further, instead of providing the ring-shaped peripheral inlet unit 61, it may be possible to form the multiple peripheral inlet openings 62 at an inner side surface of the processing vessel 2.

FIG. 2 is a diagram illustrating a cross sectional configuration of a plasma generating unit according to the exemplary embodiment.

The plasma generating unit of the plasma processing apparatus is equipped with the dielectric window 16, the slot plate 20 provided on the dielectric window 16 and the coaxial waveguide 30 (inner conductor 31) electrically connected to the slot plate 20 to propagate the microwave.

The coaxial waveguide 30 includes the pipe-shaped inner conductor 31; and the outer conductor 32 which has a pipe shape and is provided to surround the inner conductor 31. The plasma generating unit is further equipped with a pressing component PM (see FIG. 6) configured to pressurize the inner conductor 31 toward the slot plate 20 in an elastic manner.

Figure 3:
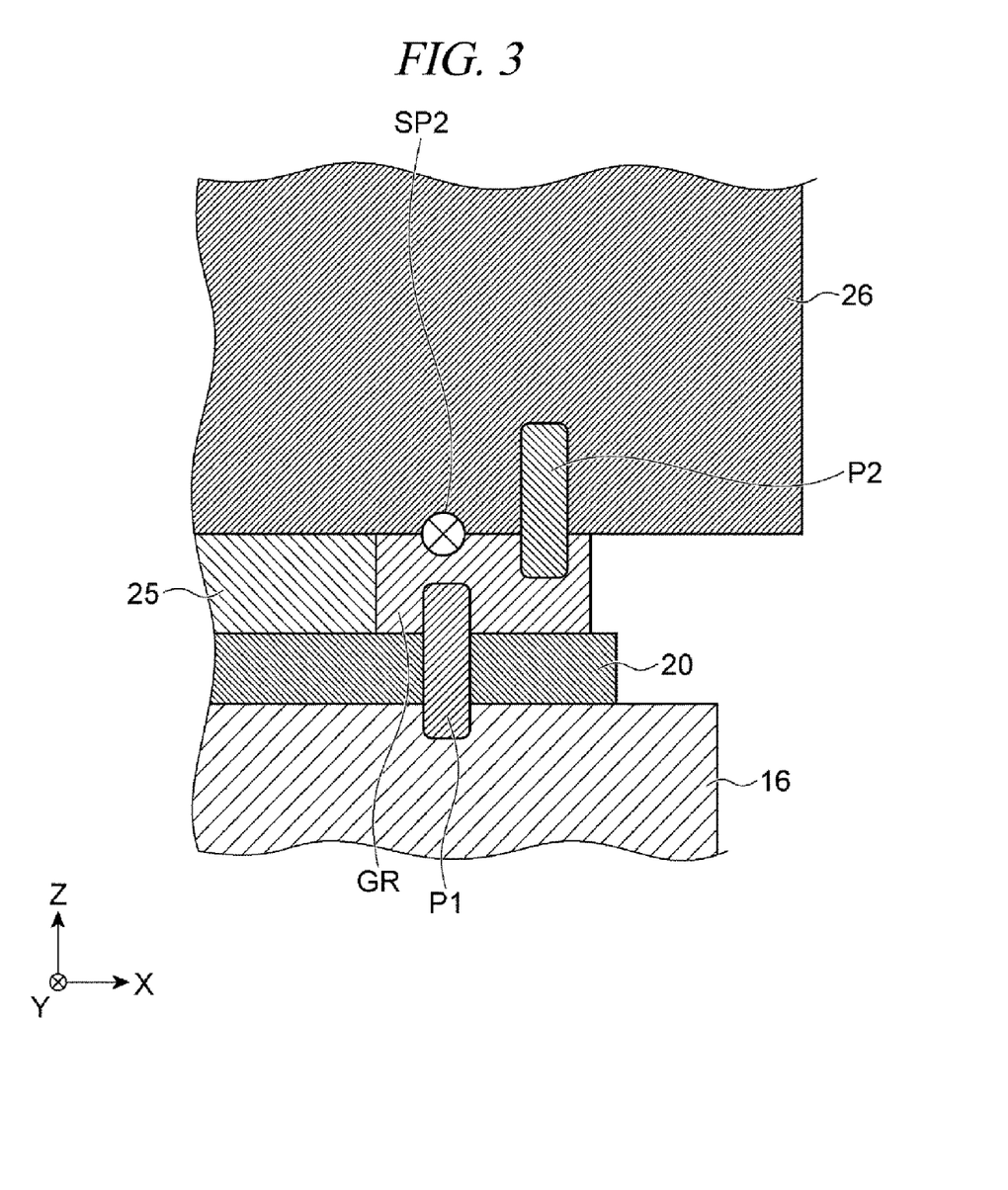
FIG. 3 is a diagram illustrating a cross sectional configuration in the vicinity of a peripheral portion of the plasma generating unit according to the exemplary embodiment.

FIG. 3 is a diagram illustrating a cross sectional configuration in the vicinity of a peripheral portion of the plasma generating unit according to the exemplary embodiment.

The plasma generating unit of this plasma processing apparatus is equipped with a wavelength shortening plate guide ring GR placed on the slot plate 20; the wavelength shortening plate 25 placed at an inner side of the wavelength shortening plate guide ring GR so that a position thereof is restricted; and the temperature control jacket 26 provided on the wavelength shortening plate 25.

The wavelength shortening plate 25 is configured to shorten the wavelength of the microwave propagated in the coaxial waveguide 30. Since a position of the wavelength shortening plate 25 is restricted by the wavelength shortening plate guide ring GR on the slot plate 20, positioning accuracy between the slot plate 20 and the wavelength shortening plate 25 can be improved. The temperature control jacket 26 is capable of adjusting the temperatures of the wavelength shortening plate 25, the coaxial waveguide 30, the slot plate 20, and so forth which are thermally connected thereto. The temperature control jacket 26 has therein a passage in which a temperature control fluid is flown. If a cooled medium is flown in this passage, the components thermally connected to the temperature control jacket 26 are cooled.

This plasma generating unit is provided with a first position fixing pin P1 which is provided between the dielectric window 16 and the wavelength shortening plate guide ring GR to be inserted through a positioning hole H1 (see FIG. 6) provided at the slot plate 20; and a second position fixing pin P2 provided between the temperature control jacket 26 and the wavelength shortening plate guide ring GR. According to this structure, the positions of the dielectric window 16, the slot plate 20 and the wavelength shortening plate guide ring GR are fixed by the first and second position fixing pins P1 and P2. Further, each of the first and second position fixing pins is plural in number within the same XY plane.

Further, a second spring SP2 is provided between the temperature control jacket 26 and the wavelength shortening plate guide ring GR. A function and a structure of the second spring SP2 are the same as those of a first spring SP1 provided between the inner conductor 31 and the slot plate 20.

Figure 4:
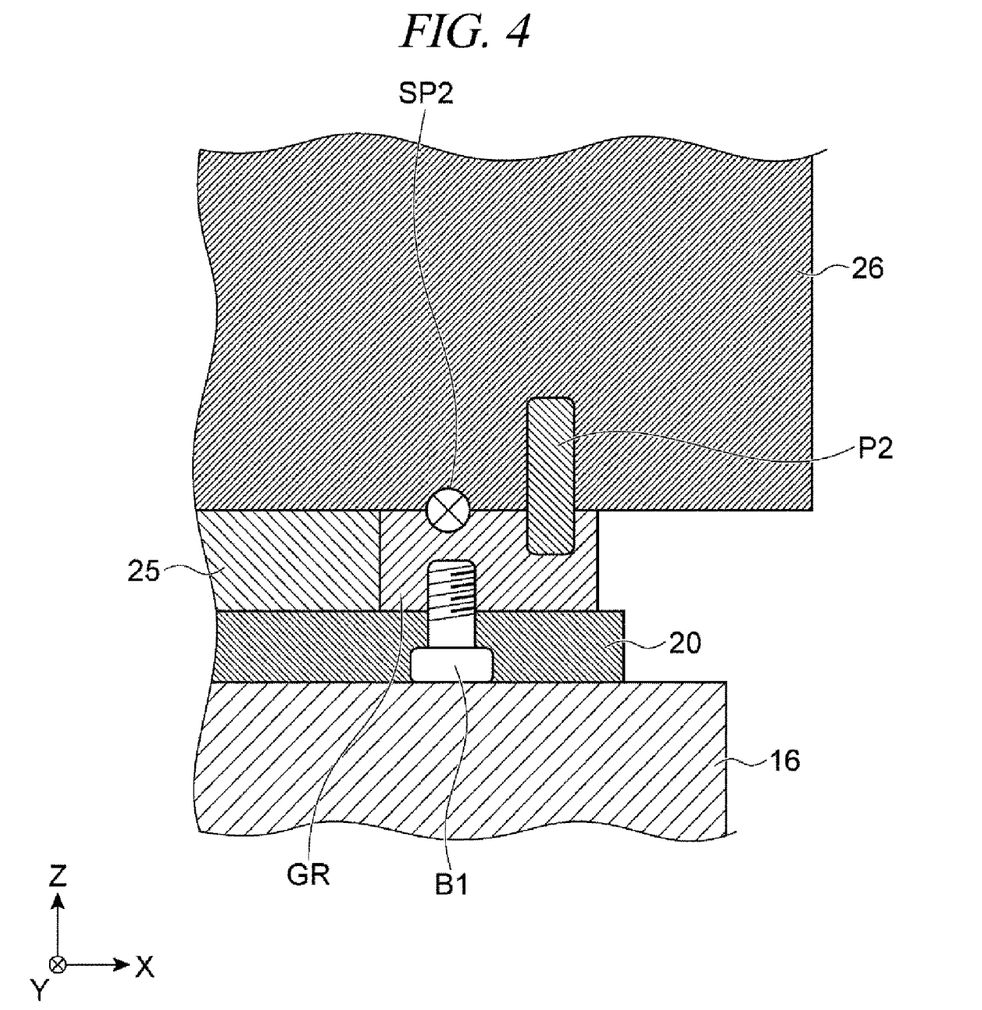
FIG. 4 is a diagram illustrating another cross sectional configuration in the vicinity of the peripheral portion of the plasma generating unit according to the exemplary embodiment.

FIG. 4 is a diagram illustrating another cross sectional configuration in the vicinity of the peripheral portion of the plasma generating unit according to the exemplary embodiment.

A structure shown in FIG. 4 is different from the structure shown in FIG. 3 in that the slot plate 20 and the wavelength shortening plate guide ring GR are fixed by a bolt B1. Accordingly, the slot plate 20 and the wavelength shortening plate guide ring GR are electrically connected. The first position fixing pin P1 of FIG. 3 and the bolt B1 are provided on the circumference of the wavelength shortening plate guide ring GR together. The bolt B1 shown in FIG. 4 can be used together with the first position fixing pin P1 of FIG. 3, so that both of enhancement of a physical position fixing force and reduction of electrical contact resistance can be achieved. If conductivity between these components is increased, heat transfer efficiency between the temperature control jacket 26, the wavelength shortening plate guide ring GR and the slot plate 20 is increased, and a potential of the slot plate 20 is stabilized.

A screw hole into which the bolt B1 is inserted is formed at a bottom surface of the wavelength shortening plate guide ring GR, and a through hole is formed through the slot plate 20 in the vertical direction. The bolt B1 is screwed into the screw hole of the wavelength shortening plate guide ring GR through the through hole, thus allowing the wavelength shortening plate guide ring GR and the slot plate 20 to be fixed strongly. As stated above, by using the position fixing pins and the bolt together, it is possible to achieve both the enhancement of the position fixing force and the improvement of the thermal and electrical characteristic while improving the positioning accuracy.

Figure 5:
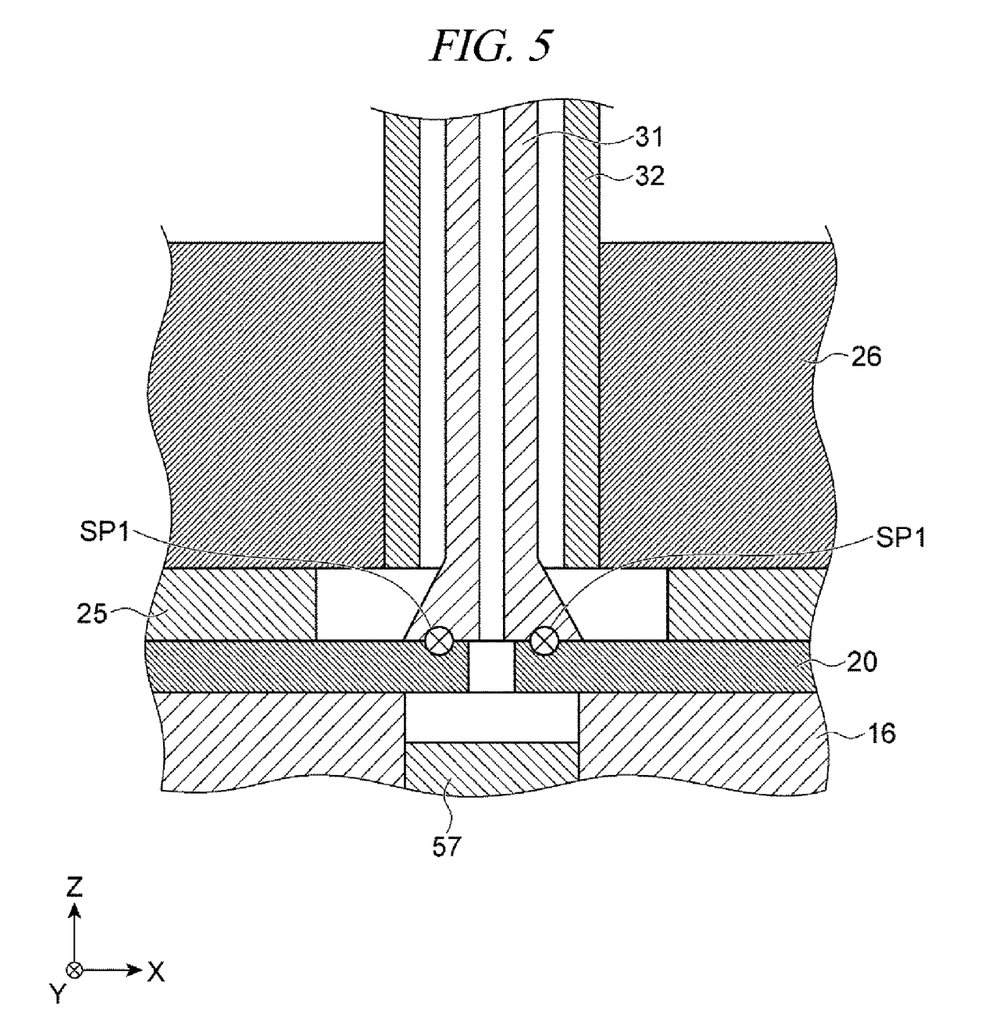
FIG. 5 is a diagram illustrating a cross sectional configuration in the vicinity of a central portion of the plasma generating unit according to the exemplary embodiment.

FIG. 5 is a diagram illustrating a cross sectional configuration in the vicinity of the central portion of the plasma generating unit according to the exemplary embodiment.

This plasma generating unit is further equipped with the first spring SP1 provided between the inner conductor 31 and the slot plate 20. The inner conductor 31 is configured to be brought into contact with the slot plate 20 from the rear side, pressurizing the slot plate 20. If the spring (compression spring) is placed at a contact position while the inner conductor 31 is pressurized by the pressing component PM (see FIG. 6), when a strong force in the −Z direction is applied to the inner conductor 31, the first spring SP1 resists against the pressing force caused by the pressing component PM, so that there is generated a force pressurizing the inner conductor 31 in the reverse direction (+Z direction). Accordingly, a contact pressure between the inner conductor 31 and the slot plate 20 can be appropriately maintained, and the inner conductor 31 can be brought into secure contact with the slot plate 20.

Furthermore, by using a conductive material such as stainless steel or aluminum for the first spring SP1, the inner conductor 31 and the slot plate 20 can be electrically connected as well in a secure manner. Though it might be desirable to use, as the first spring SP1, a shield spiral, a spiral coil or a gasket surrounding an axis of the inner conductor 31, the type of the spring is not merely limited to these examples as long as the spring is the compression spring because all compression springs have the same function.

Figure 6:
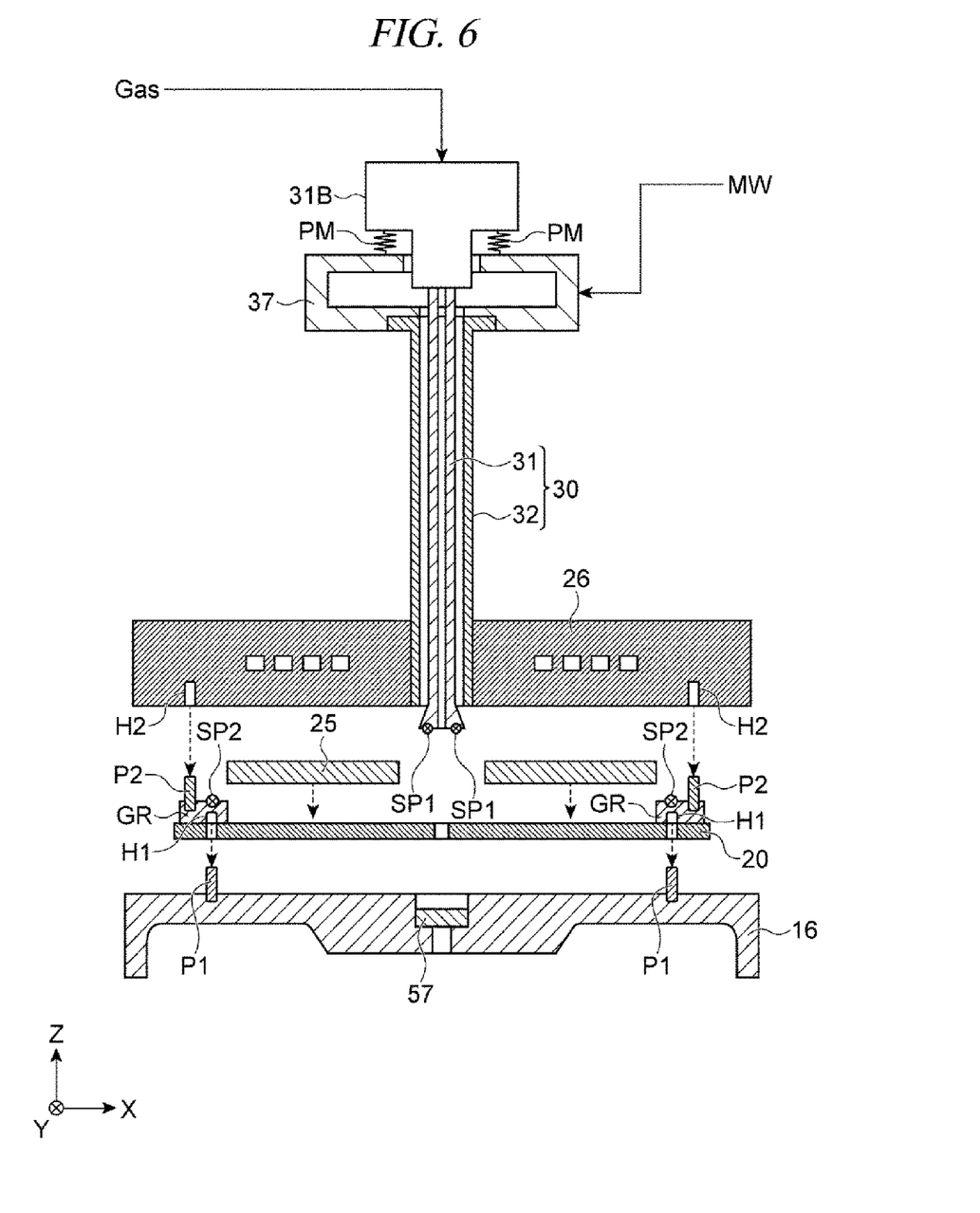
FIG. 6 is a diagram illustrating an assembly method of the plasma generating unit according to the exemplary embodiment.

FIG. 6 is a diagram illustrating an assembly method of the plasma generating unit according to the exemplary embodiment.

Regarding the structure according to the exemplary embodiment, when assembling the plasma generating unit, the slot plate 20 may be previously mounted on the dielectric window 16, and, then, the inner conductor 31 pressurized by the pressing component PM may be installed to be in contact with the slot plate 20. That is, in this structure, the positioning accuracy between the slot plate 20 and the dielectric window 16 when they are assembled does not rely on the positioning accuracy of the inner conductor 31.

When assembling the components, an assembly is first prepared by assembling the slot plate 20 and the wavelength shortening plate guide ring GR with the bolt B1 as shown in FIG. 4. Subsequently, this assembly (the slot plate 20 and the wavelength shortening plate guide ring GR) is fastened to the dielectric window 16 via the first position fixing pin P1. The first position fixing pin P1 is inserted into the hole H1 of the wavelength shortening plate guide ring GR through the hole of the slot plate 20. Then, the wavelength shortening plate 25 is fitted inside the wavelength shortening plate guide ring GR. Thereafter, the temperature control jacket 26 as an upper unit is fastened to the slot plate 20 along with the coaxial waveguide 30. The second position fixing pin P2 is inserted into a fixing hole H2 provided at a bottom surface of the temperature control jacket 26, thus allowing the temperature control jacket 26 to be fixed to the wavelength shortening plate guide ring GR. The upper unit is a set of the temperature control jacket 26 and the coaxial waveguide 30, and these components are previously fixed.

Since the first spring SP1 is fastened to a lower end surface of the inner conductor 31 of the coaxial waveguide 30, the first spring SP1 first comes into contact with the top surface of the slot plate 20 to apply a downward force, so that the lower end surface of the inner conductor 31 is brought into contact with the slot plate 20.

Figure 7:
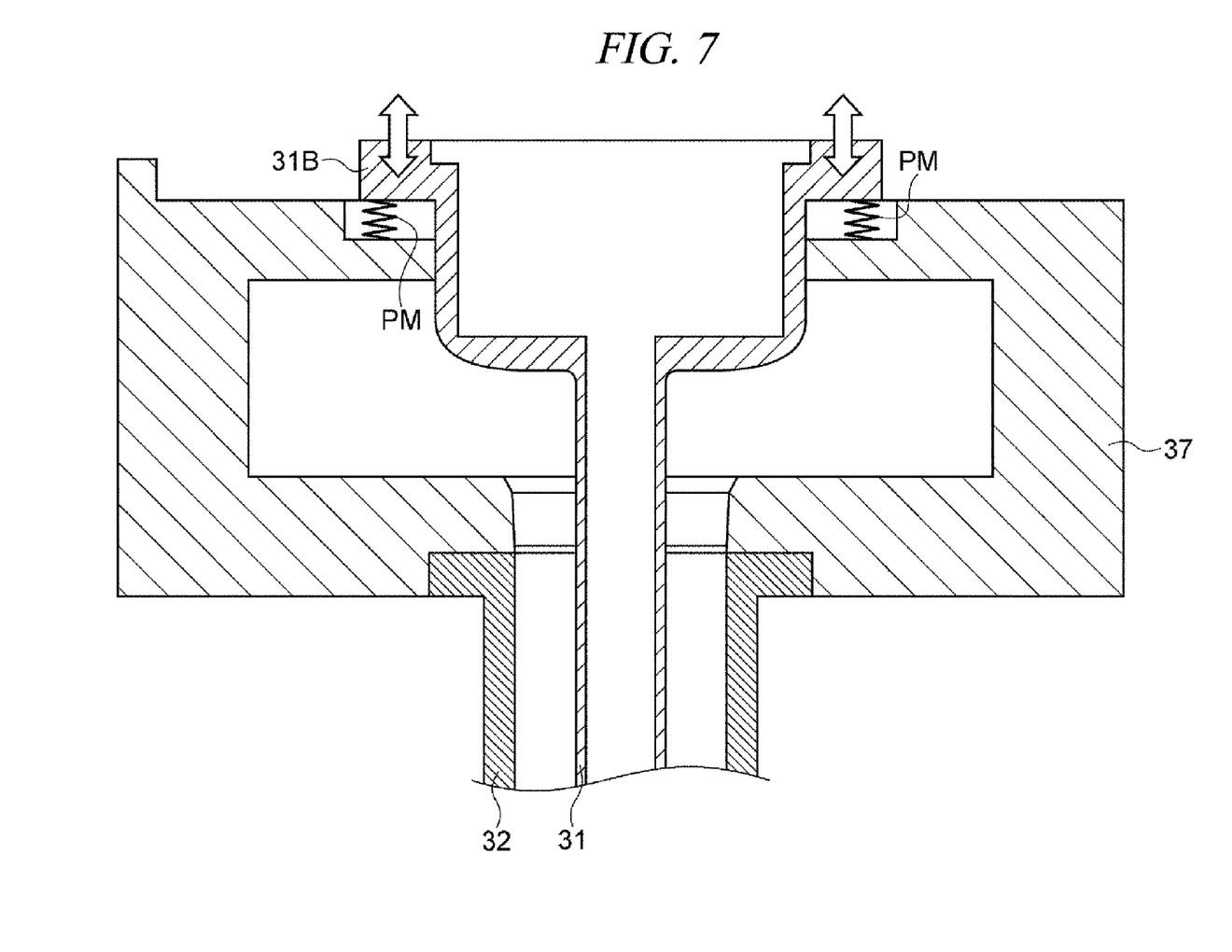
FIG. 7 is a diagram illustrating a cross sectional configuration in the vicinity of a pressing component of the plasma generating unit.

FIG. 7 is a diagram illustrating a cross sectional configuration in the vicinity of the pressing component of the plasma generating unit according to the exemplary embodiment.

As depicted in FIG. 6 and FIG. 7, an upper end of the pipe-shaped outer conductor 32 is fixed to a bottom surface of the mode converter 37, and the inner conductor 31 is fixed to a supporting body 31B having a space for a gas supply. Provided between the supporting body 31B and the mode converter 37 is the pressing component PM. Though the pressing component PM is implemented by a bellows-shaped tension spring in the exemplary embodiment, the kind of the pressing component PM is not limited thereto as long as it pushes the inner conductor 31 downwards.

Further, as a non-illustrated comparative example, there will be considered a case where the inner conductor 31 is previously fixed to the slot plate 20 to be in contact therewith, and the upper unit including the inner conductor 31 and the slot plate 20 is fastened to the dielectric window 16. In this case, the positioning accuracy of the slot plate 20 with respect to the dielectric window 16 depends on the positioning accuracy of the inner conductor 31. Since this upper unit has a large volume, it is difficult to check an underneath position when fastening this upper unit. Thus, the assembling accuracy of the above case is lower than that in case of fastening the slot plate alone to the dielectric window.

Meanwhile, in the plasma generating unit according to the present exemplary embodiment, since the inner conductor 31 can be mounted after fastening the slot plate 20 to the dielectric window 16, the positioning accuracy between the slot plate 20 and the dielectric window 16 is improved. In-surface uniformity of the plasma depends on the positioning accuracy between the slot plate 20 and the dielectric window 16. If this positioning accuracy is deteriorated, the in-surface uniformity of the plasma is degraded, and, on some occasions, even an abnormal discharge may be observed. Particularly, if the dielectric window 16 has a pattern such as a recess 15S (see FIG. 1), the degree of the contribution of the positioning accuracy to the in-surface uniformity of the plasma is increased. The recess may have any of various known shapes and patterns, and this recess is provided in plural in number and these plural recesses are arranged in the circumferential direction of the dielectric window 16 to surround an axis of the dielectric window 16. As stated, in the plasma generating unit according to the present exemplary embodiment, since the positioning accuracy is improved, the in-surface uniformity of the plasma can be bettered.

Figure 8:
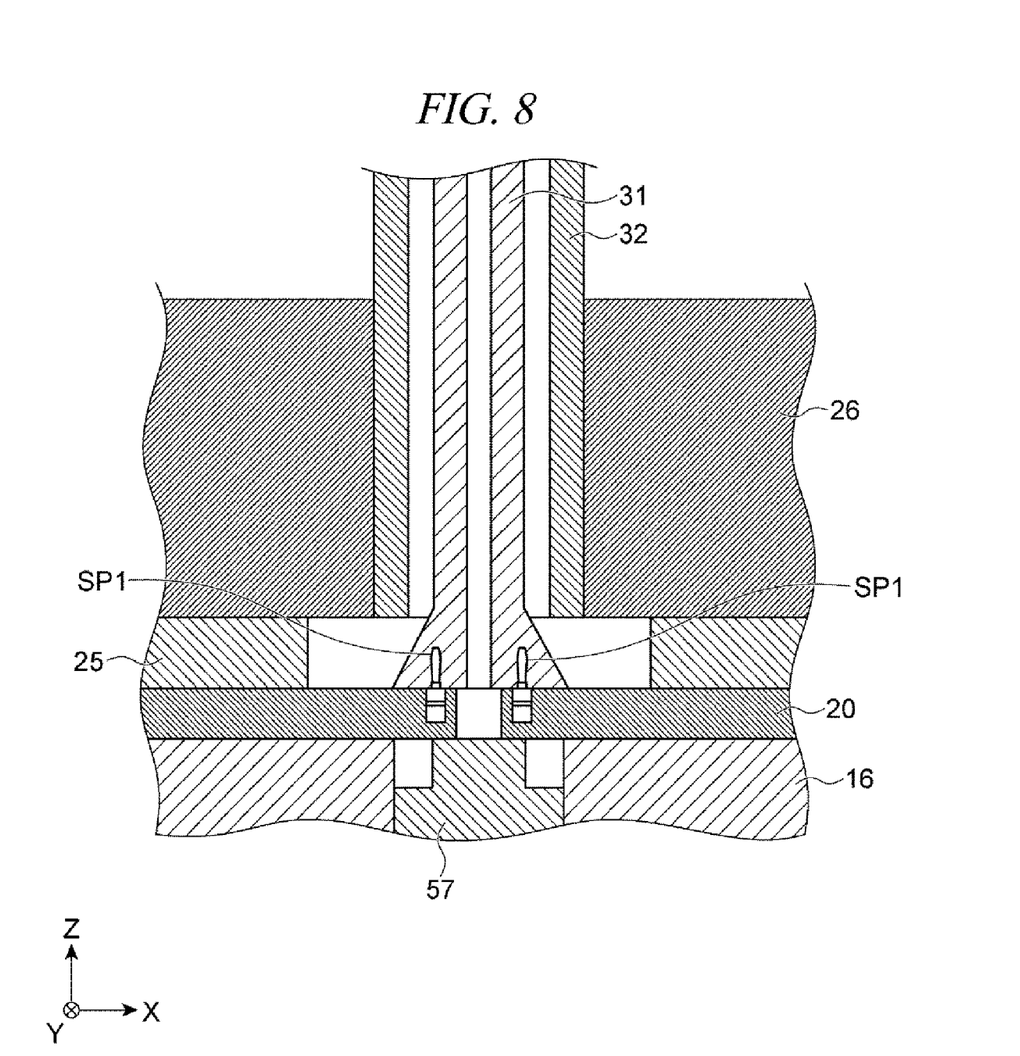
FIG. 8 is a diagram illustrating a cross sectional configuration in the vicinity of a central portion of a plasma generating unit according to the exemplary embodiment.

FIG. 8 is a diagram illustrating a cross sectional configuration in the vicinity of a central portion of a plasma generating unit according to the exemplary embodiment.

Besides the spiral, the spring or the gasket, one having elasticity such as a banana jack may be used as the aforementioned first spring SP1, as shown in FIG. 8. This first spring SP1 is provided such that is stands from the slot plate 20 in the Z direction to be inserted into an insertion hole provided at the inner conductor 31. When inserted into the insertion hole, the banana jack applies a pressure to the inner conductor 31 in the +Z direction, whereas after being inserted thereinto, the banana jack applies a pressure in the −Z direction. In this drawing, since the internal conductor 31 has the pipe shape, the multiple first springs SP1 are fixed to the slot plate 20.

Figure 9:
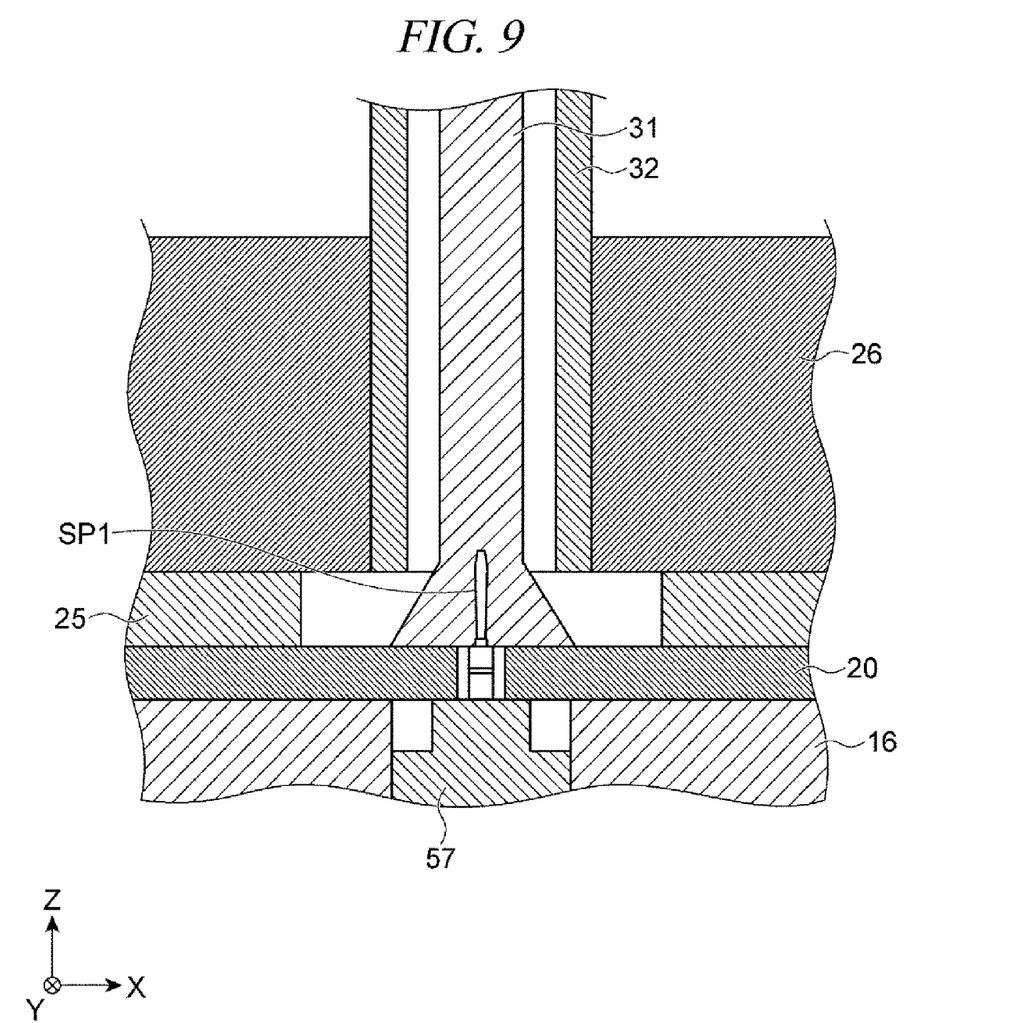
FIG. 9 is a diagram illustrating a cross sectional configuration in the vicinity of a central portion of a plasma generating unit according to the exemplary embodiment.

FIG. 9 is a diagram illustrating a cross sectional configuration in the vicinity of a central portion of a plasma generating unit according to the exemplary embodiment.

In this drawing, since the internal conductor 31 is not of the pipe shape, a single first spring SP1 is fixed to the slot plate 20.

A separation position of the upper unit may be set between the temperature control jacket 26 and the coaxial waveguide 30.

Figure 10:
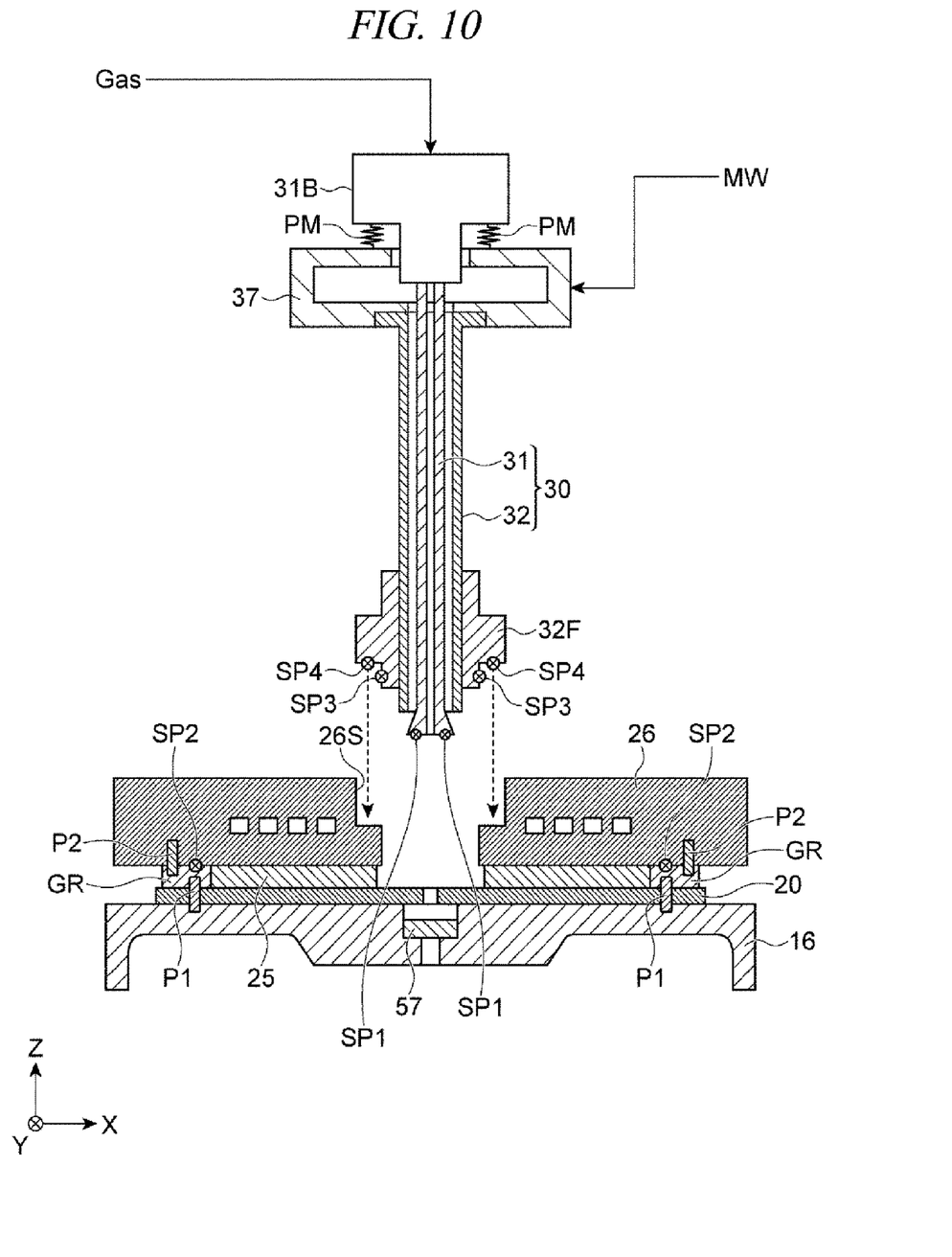
FIG. 10 is a diagram illustrating an assembly method of the plasma generating unit according to the exemplary embodiment.

FIG. 10 is a diagram illustrating a method of assembling the plasma generating unit according to such an exemplary embodiment.

The plasma generating unit of this plasma processing apparatus further includes a flange component 32F fixed to the outer conductor 32. The flange component 32F is engaged with an inner side surface 26S of a through hole of the temperature control jacket 26, and the outer conductor 32 is located within the through hole. The inner side surface 26S of the temperature control jacket 26 has a step, and the flange component 32F is engaged with this step. When necessary, a third spring SP3 and a fourth spring SP4 may be fastened to the flange component 32F, as illustrated in FIG. 10. These third and fourth springs SP3 and SP4 may have the same structure as the first spring SP1. According to this structure, the positioning of the outer conductor with respect to the temperature control jacket 26 can be easily performed. Further, when the outer conductor and the temperature control jacket 26 are assembled, the temperature control jacket 26 can be moved up and down by using an air cylinder device or the like.

In the present exemplary embodiment, though the bolt B1 is used for the electrical connection between the slot plate 20 and the wavelength shortening plate guide ring GR, a third spring (not shown) may be provided between the slot plate 20 and the wavelength shortening plate guide ring GR instead of the bolt B1. A function and a structure of the third spring may be the same as those of the first spring SP1 provided between the inner conductor 31 and the slot plate 20 and the second spring SP2 provided between the temperature control jacket 26 and the wavelength shortening plate guide ring GR. Further, the bolt B1 and the third spring may be used together.

As stated above, the aforementioned plasma processing apparatus is prepared by providing one of the aforementioned plasma generating units in the processing vessel 2. According to this plasma processing apparatus, since the in-surface uniformity of the plasma can be improved, the uniform processing can be performed on the target object. Furthermore, since the wavelength shortening plate is prepared as a single component when it is mounted to the apparatus, the wavelength shortening plate is of a light weight and the positioning thereof can be performed easily. Furthermore, since the slot plate is not affected by the coaxial waveguide, the bending of the slot plate that might be caused by thermal expansion does not occur. In addition, according to the above-described structure, the deformation during the assembling work or the manufacturing error between the apparatuses can also be improved. Further, since a parallel deviation of the antenna unit including the slot plate is reduced due to the increase of uniformity of the plasma, the non-uniformity in the etching processing or the like may be reduced. Moreover, since the weight of the components is lightened, a parallel deviation thereof becomes difficult to occur when the components are moved up during the assembling, so that the adjustment of parallelism is eased. Since the inner conductor is allowed to be moved with respect to the slot plate on a horizontal plane, tolerance in apparatus configuration is increased. Furthermore, during the assembling, even if the wavelength shortening plate or the coaxial waveguide attempts to be deviated in parallel, such a deviation can be easily corrected as there is the guide or the step.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

We claim:

1. A plasma generating unit provided in a plasma processing apparatus, comprising:
    a dielectric window;
    a slot plate provided on the dielectric window; and
    a coaxial waveguide electrically connected to the slot plate and configured to transmit a microwave, wherein the coaxial waveguide is connected to a microwave generator via a mode converter,
    wherein the coaxial waveguide comprises:
    an inner conductor; and
    an outer conductor configured to surround the inner conductor,
    wherein the plasma generating unit further comprises a pressing component configured to elastically press the inner conductor toward the slot plate such that a bottom surface of the inner conductor is in direct contact with a top surface of the slot plate, and
    wherein the inner conductor is fixed to a supporting body and the pressing component is provided between the supporting body and the mode converter.

2. The plasma generating unit of claim 1, further comprising:
    a spring provided between the inner conductor and the slot plate.

3. The plasma generating unit of claim 1, further comprising:
    a wavelength shortening plate guide ring provided on the slot plate;
    a wavelength shortening plate placed at an inner side of the wavelength shortening plate guide ring such that a position thereof is restricted; and
    a temperature control jacket provided on the wavelength shortening plate.

4. The plasma generating unit of claim 3, further comprising:
    a first position fixing pin provided between the dielectric window and the wavelength shortening plate guide ring to be inserted through a positioning hole provided at the slot plate; and
    a second position fixing pin provided between the temperature control jacket and the wavelength shortening plate guide ring.

5. The plasma generating unit of claim 3, further comprising:
    a flange component fixed to the outer conductor,
    wherein the flange component is engaged with an inner side surface of a through hole provided in the temperature control jacket, and the outer conductor is located within the through hole.

6. A plasma processing apparatus comprising a plasma generating unit, provided at a processing vessel, as claimed in claim 1.

* * * * *